United States Patent [19]
Vig

[11] Patent Number: 5,512,864
[45] Date of Patent: Apr. 30, 1996

[54] METHOD AND APPARATUS FOR COMPENSATING FOR NEUTRON INDUCED FREQUENCY SHIFTS IN QUARTZ RESONATORS

[75] Inventor: John R. Vig, Colts Neck, N.J.

[73] Assignee: The United States of America as represented by the Secretary of the Army, Washington, D.C.

[21] Appl. No.: 211,510

[22] Filed: May 31, 1988

[51] Int. Cl.[6] ............................................. H03B 5/32
[52] U.S. Cl. ............................................. 331/162
[58] Field of Search ...................... 331/36 R, 36 C, 331/36 L, 3, 162, 116 R, 158

[56] References Cited

U.S. PATENT DOCUMENTS 4,575,690  3/1986  Walls et al. ........................... 331/162

OTHER PUBLICATIONS

"The Pile Irradiation of Quartz Crystal Oscillators" by F. B. Johnson and R. S. Pease, pp. 651–654 1954.

"Proceedings of the 16th Annual Symposium on Frequency Control", 25≧27 Apr. 1962, Shelburne Hotel, Atlantic City, New Jersey.

*Primary Examiner*—David C. Cain
*Attorney, Agent, or Firm*—Michael Zelenka

[57] ABSTRACT

A neutron radiation insensitive crystal oscillator. The device includes two crystals with neutron sensitivity coefficients of opposite sign. The crystals may be connected either in parallel or series relationships. The addition of tuning reactances to the circuit permits control of the circuit's overall resonance.

26 Claims, 1 Drawing Sheet

METHOD AND APPARATUS FOR COMPENSATING FOR NEUTRON INDUCED FREQUENCY SHIFTS IN QUARTZ RESONATORS

The invention described herein may be manufactured, used, and licensed by or for the Government for governmental purposes without the payment of any royalties thereon or therefor.

FIELD OF THE INVENTION

This invention relates generally to improvements in quartz crystal oscillators and more particularly to apparatus and methods for reducing or eliminating neutron radiation induced frequency shifts in such oscillators.

BACKGROUND OF THE INVENTION

Within recent years considerable attention has been given to the effects of electromagnetic and particle irradiation on the performance of various electronic components and systems. Such interest has been generated by, for example, the need to predict the performance of control and communications systems employed in earth satellites, space probes and ballistic missiles. Those concerned with the development of sophisticated timing and frequency control oscillators have continually searched for methods and apparatus that will reduce or eliminate the sensitivity of these devices to neutron radiation.

Generally, fast neutron (i.e. neutrons having energies in excess of 0.1 MeV) causes a change in a quartz oscillator's resonant frequency. The neutron sensitivity coefficient is the frequency change per neutron fluence. For AT-cut and SC-cut resonators the sign of the neutron sensitivity coefficient is positive. Frequency increases approximately linearly with fluence. For AT- and SC-cut resonators the slopes range from $+0.7 \times 10^{-21}/n/cm^2$ at very high fluences ($10^{17}$ to $10^{18}$ n/cm$^2$) to $8 \times 10^{-21}/n/cm^2$ at $10^{10}$ to $10^{12}$ n/cm$^2$. Sensitivity probably depends somewhat on the quartz defect density and on the neutron distribution. (Thermonuclear neutrons cause more damage than reactors').

A negative neutron sensitivity coefficient has been observed in BT-cut quartz, as mentioned in: Johnson et al., "The Pile Irradiation of Quartz Crystal Oscillators" Phil. Mag 45, 651 (1954). Positive neutron sensitivity coefficients are discussed in J. C. King et al., "Effects of Reactor Irradiation on Thickness Shear Crystal Resonators", Proc. 16th Ann. Frequently Control Symposium p. 8 (1962).

In co-pending application Ser. No. 719,922, entitled "Method of Making Radiation Hardened Crystal Quartz Oscillators", two oscillators, one of which possesses a negative neutron induced frequency shift coefficient and the other a positive frequency shift coefficient are used to compensate for neutron induced frequency shifts. The difference frequency produced by the neutron radiation is used as an error signal that is fed back to compensate the frequency of one of the resonators.

An example of circuitry useful in reducing acceleration induced frequency shifts in crystal oscillators is provided by U.S. Pat. No. 4,575,690 entitled "Acceleration Insensitive Oscillator", issued to Walls and the present inventor.

SUMMARY OF THE INVENTION

It is an object of the present invention, therefore, to provide an improvement in the suppression of neutron radiation induced frequency shifts in crystal controlled oscillators.

It is another object of the present invention to provide a substantial cancellation of neutron radiation effects on the crystal resonators of a crystal controlled oscillator.

And a further object of the present invention is to provide a substantial cancellation of neutron radiation induced effects on the crystals of a crystal controlled oscillator which simultaneously providing a substantially exact value of the desired oscillator frequency.

These and other objects are achieved by utilizing a circuit which features two quartz crystal resonators, one of which possesses a negative neutron induced frequency shift coefficient and the other a positive neutron induced frequency shift coefficient. The resonators may be connected either in series or in parallel. Two variable capacitors are utilized as a compensation adjustment capacitor and frequency adjustment capacitor respectively. The entire aforedescribed apparatus is then connected to conventional oscillator circuitry similar to what would be used under ordinary circumstances for a single resonator. The resulting apparatus will exhibit great frequency stability in the presence of fast neutron radiation.

Where the crystals are electrically connected in series to the oscillator, a variable load reactance, e.g., a load capacitor, is connected in parallel across one of the crystals. Where the crystals are coupled in parallel to the oscillator circuit, a variable load reactance is connected in series with one of the crystals. The load reactance is adjusted until any remaining neutron sensitivity is reduced to zero. A second variable load reactance is connected in series between the pair of crystals and the oscillator circuit for fine tuning the oscillator's output frequency to a desired value. The load reactances may be both capacitive or both inductive, or one may be capacitive and the other inductive.

DESCRIPTION OF THE DRAWINGS

While the present invention is defined in the claims annexed to and forming a part of the specification, a better understanding can be had by reference to the following description when taken in conjunction with the accompanying drawings in which:

DETAILED DESCRIPTION OF THE DRAWINGS

Any given quartz crystal may be characterized, as mentioned before, by a neutron sensitivity coefficient. The neutron sensitivity coefficient is a measure of change, Δf, of the resonant frequency, f, due to a given neutron fluence, measured in neutrons per square centimeter. While in most reported results the crystals exhibit a positive neutron sensitivity coefficient, i.e. their resonant frequency slightly increases when they are irradiated by neutrons, some crystals can exhibit a negative neutron sensitivity coefficient, i.e. the resonant frequency decreases upon neutron irradiation.

Figure 1:
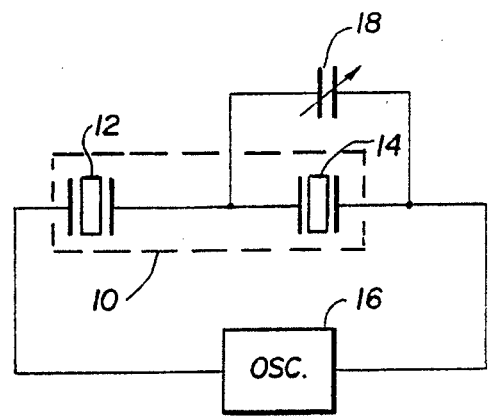
FIG. 1 is an electrical block diagram illustrative of a first embodiment of the invention.

Turning now to FIG. 1, reference numeral 10 denotes a composite crystal resonator made up of two crystals 12 and 14 which have neutron sensitivity coefficients of opposite signs. The two crystal resonators 12 and 14 are connected electrically in series to an electrical oscillator circuit 16 with a composite resonator 10 being the primary frequency determining element of the oscillator circuit. An improvement in the cancellation of neutron radiation induced effects is achieved in the present invention by inclusion of a variable load capacitor 18 which may be a varactor diode which is coupled in parallel across the crystal that has the larger absolute value of neutron sensitivity coefficient. In the embodiment illustrated in FIG. 1, it is assumed that crystal 14 has a neutron sensitivity coefficient of magnitude (i.e. absolute value) greater than the coefficient of crystal 12. The purpose of the variable load capacitor 18 is to cancel any net or resultant sensitivity exhibited by crystals 12 and 14 in tandem.

The following example will provide convincing evidence of the feasibility of the circuit illustrated in FIG. 1. Assume that crystal 14 is a 5 MHz BT-cut resonator with a neutron sensitivity coefficient of $-7\times10^{-21}$/n/cm$^2$. Crystal 12 may be assumed to be a 5 MHz SC-cut resonator of neutron sensitivity coefficient $+6\times10^{-21}$/n/cm$^2$. Assume that the capacitance of variable capacitor 18 is varied continuously. In the limit when capacitor 18 is very large, crystal 14 is shorted out (i.e. all the current goes through capacitor 18 and no current through crystal 14). Consequently, the neutron sensitivity of the oscillator is that of crystal 12, i.e. $+6\times10^{-21}$/n/cm$^2$. In the limit when capacitor 18 is very small, all of the current goes through crystal 14 and the net oscillator neutron sensitivity coefficient is approximately the difference between the two resonator coefficients, i.e. $-1\times10^{-21}$/n/cm$^2$. Thus, as capacitor 18 is varied through values from large to small, the net oscillator neutron sensitivity coefficient varies from $+6\times10^{-21}$/n/cm$^2$ to approximately $-1\times10^{-21}$/n/cm$^2$. Consequently, it is clear that there exists a value for capacitor 18 for which the net oscillator neutron sensitivity coefficient is zero in the range of expected neutron fluences.

Figure 3:
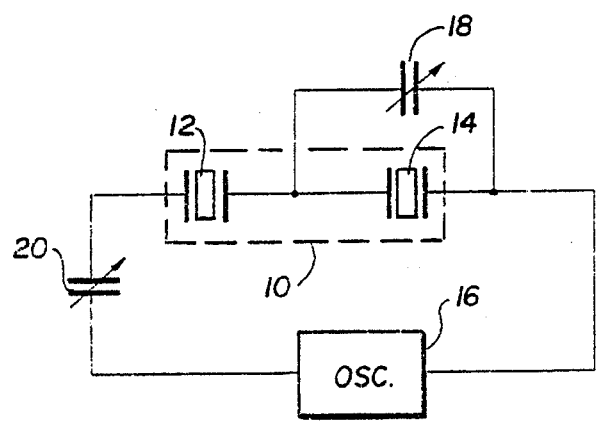
FIG. 3 is an electrical block diagram of a modification of the embodiment shown in FIG. 1.

The adjustment of variable capacitor 18 to a value at which the oscillator neutron sensitivity coefficient is zero, will, in general, result in an oscillator output frequency that is slightly off from the desired value. In FIG. 3, an additional variable capacitor 20 is added in parallel with resonators 12 and 14. Variable capacitor 20 is adjusted to shift the net oscillator output frequency to the desired value.

Figure 2:
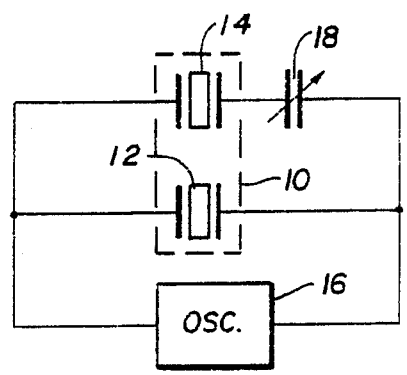
FIG. 2 is an electrical block diagram illustrative of a second embodiment of the invention.

With respect to FIG. 2, the embodiment shown there includes a circuit configuration wherein the two resonators 12 and 14 making up the composite crystal resonator 10 are connected in parallel with one another across oscillator circuit 16. Variable capacitor 18 is coupled in series with the crystal 14 which is the crystal which has the larger magnitude neutron sensitivity coefficient. In the configuration illustrated in FIG. 2, variable capacitor 18 essentially serves to tune resonator 14 so that its frequency shift is equal in magnitude but opposite in sign to that of resonator 12.

Figure 4:
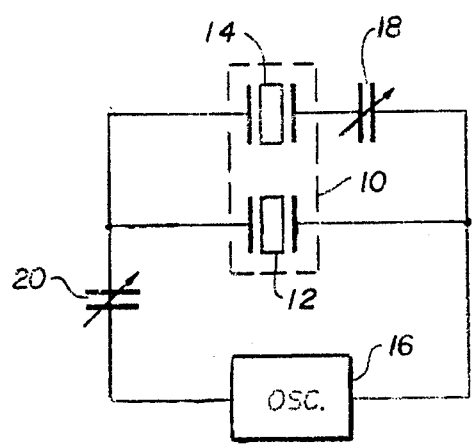
FIG. 4 is an electrical block diagram illustrative or a modification of the embodiment shown in FIG. 2.

In FIG. 4, variable capacitor 20 is placed in series with oscillator combination 10. Variable capacitor 20 serves to adjust the net oscillator output frequency to the desired value.

In FIGS. 1-4, variable capacitors 18 and 20 may be replaced by variable inductors.

When two resonators 12 and 14 are connected in series or in parallel as shown in FIGS. 1 and 2, but without variable capacitor 18, the oscillator frequency will be exactly the average of the two resonator frequency (with the appropriate and same equivalent load capacitors) only if the resonator equivalent circuit parameters of resonators 12 and 14 are equal. In general, e.g., in the examples mentioned above, the parameters of the two resonators 12 and 14 will not be equal.

Therefore, the net neutron sensitivity coefficient of the resulting oscillator will not be exactly the arithmetical difference between the two resonator coefficients but will be weighted by a complex expression that is a function of the resonator equivalent circuit parameters and of the two resonator resonant frequencies. That is, if $N_0$ is the oscillator neutron sensitivity coefficient and $N_{R1}$ and $N_{R2}$ are the neutron sensitivity coefficients of resonators 12 and 14 respectively, then:

$$N_0 = N_{R1} - kN_{R2}$$

where k is a function of the equivalent circuit parameters, namely the equivalent resistance and motional capacitance and inductance and the resonant frequency of resonators 12 and 14. The value of k is calculable. However, it may be more practical to determine empirically the value of variable capacitor 18.

The circuits illustrated in FIGS. 1-4 may also be applied to other pairs of resonators in which the radiation induced frequency shift is in opposite directions. For example, referring to FIG. 1, resonator 12 may be one which with no DC-bias applies, shifts in the negative direction when irradiated with, for example, 50K rads of gamma radiation and resonator 14 may be one which with no DC-bias applied to the electrodes, shifts in a positive direction when irradiated with 50K rads of gamma radiation.

This invention applies to resonators not only made of quartz but of other materials as well, for example, berlinite and lithium tantalite. The invention further is applicable not only to bulk wave resonators, but also to other types of resonators such as surface acoustic wave resonators and shallow bulk acoustic wave resonators.

While there has been shown and described what is at present considered to be the preferred embodiments of the invention, it is noted that the same has been made by way of illustration and not limitation. Accordingly, all modifications, alterations and changes coming within the spirit and scope of the invention as set forth in the appended claims and their legal equivalents are herein meant to be included.

What is claimed is:

1. A method of reducing the effects of neutron radiation acting on a crystal resonator which is the primary frequency determining element of a crystal controlled oscillator, comprising the steps of:

determining the value of the neutron sensitivity coefficient for a first crystal;

determining the value of the neutron sensitivity coefficient for a second crystal, said first crystal having a positive neutron sensitivity coefficient and said second crystal having a negative neutron sensitivity coefficient;

electrically coupling said two crystals as a composite crystal resonator to an electrical oscillator circuit; and coupling electrical reactance means to one of said crystals for cancelling any difference in the resulting neutron sensitivity of said composite crystal.

2. The method as defined by claim 1 wherein said reactance means comprises capacitive reactance means.

3. The method as defined by claim 1 wherein said reactance means comprises inductive reactance means.

4. The method as defined by claim 1 wherein said two crystals are electrically connected in series to said oscillator circuit and wherein said reactance means comprises variable capacitance means coupled in parallel across one of said two crystals.

5. The method as defined by claim 4 wherein said variable capacitance means is coupled across the crystal of said crystals having the greater magnitude of neutron sensitivity coefficient.

6. The method as defined by claim 1 wherein said first and second crystal are connected in parallel to said oscillator circuit.

7. The method as defined by claim 6 and wherein said reactance means is connected in series to one of said crystals.

8. The method as defined by claim 7 wherein said reactance means comprises capacitive reactance means.

9. The method as defined by claim 7 wherein said reactance means comprises inductive reactance means.

10. The method as defined by claim 7 wherein said reactance means comprises variable capacitance means connected in series to the crystal of said two crystals having the larger magnitude of neutron sensitivity coefficient.

11. The method as defined by claim 1 and additionally including the step of coupling electrical reastance means between said composite resonator and said oscillator circuit for adjusting the output frequency of the oscillator circuit.

12. The method as defined by claim 11 wherein said reactance means of the last recited step comprises capacitive reactance means.

13. The method as defined by claim 11 wherein said reactance means of the last recited step comprises inductive reactance means.

14. The method as defined by claim 11 wherein said reactance means coupled between said composite and said oscillator circuit comprises variable capacitance means coupled in series therebetween.

15. The apparatus for reducing the effects of vibration on a piezoelectric crystal resonator constituting the primary frequency determining element of a crystal controlled oscillator, comprising:

an oscillator;

a composite crystal resonator coupled to said oscillator and comprising first and second resonator crystals, each having a neutron sensitivity coefficient of unequal magnitude, said crystals being further positioned such that the neutron sensitivity coefficient of the first crystal is of opposite sign to the neutron sensitivity coefficient and said second crystal whereby the effective neutron sensitivity of the resonant frequency of the composite crystal resonator is substantially reduced; and electrical reactance meand coupled to at least one of said first and second resonator crystals for cancelling any net neytron sensitivity between said crystals.

16. The apparatus as defined by claim 15 wherein said reactance means comprises capacitive reactance means.

17. The apparatus as defined by claim 15 wherein said reactance means comprises inductive reactance means.

18. The apparatus as defined by claim 15 wherein said first and second resonator crystals are connected in series to said oscillator and wherein said reactance means comprises variable capacitance means coupled in parallel across one of said resonator crystals.

19. The apparatus as defined by claim 18 wherein said variable capacitance means is coupled across the resonator crystal having the greater magnitude of neutron sensitivity coefficient.

20. The apparatus as defined by claim 15 wherein said first and second resonator crystals are connected in parallel to said oscillator and wherein said reactance means comprises variable capacitance means coupled in series to one of said resonator crystals.

21. The apparatus as defined by claim 20 and wherein said variable capacitance means is coupled in series to the resonator crystal having the greater magnirude of neutron sensitivity coefficient.

22. The apparatus as defined by claim 15 and additionally including electrical reactance means coupled between said composite resonator and said oscillator for adjusting the output frequency of said oscillator to a desired value.

23. The apparatus as defined by claim 22 wherein said last recited reactance means comprises capacitive reactance means coupled in series between said composite resonator and said oscillator.

24. The apparatus as defined by claim 22 wherein said last recited reactance means comprises inductive reactance means coupled in series between said composite resonator and said oscillator.

25. The apparatus as defined by claim 22 and wherein said first and second crystals additionally have different capacitance ratios and are connected in series, and wherein said first recited reactance means coupled to one of said resonator crystals comprises variable capacitance means coupled in parallel to said one crystal whereby the parallel connected variable capacitance means is used to produce substantially zero net neutron sensitivity and wherein said last recited reactance means comprises variable capacitance means used as an output frequency tuning capacitor.

26. The apparatus as defined by claim 22 wherein said first and second additionally have different capacitance ratios and are connected in parallel and wherein said first recited reactance means coupled to one of said resonator crystals comprises variable capacitance means coupled in series to said one crystal, whereby the first recited series capacitor means is used to produce substantially zero net neutron sensitivity and wherein said last recited reactance means comprises variable capacitance means used as an output frequency tuning capacitor.

* * * * *